(12) United States Patent
Seshita et al.

(10) Patent No.: US 10,911,007 B2
(45) Date of Patent: Feb. 2, 2021

(54) HIGH-FREQUENCY AMPLIFIER CIRCUITRY AND SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Toshiki Seshita, Kanagawa (JP); Yasuhiko Kuriyama, Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 13 days.

(21) Appl. No.: 16/290,074

(22) Filed: Mar. 1, 2019

(65) Prior Publication Data

US 2020/0007094 A1 Jan. 2, 2020

(30) Foreign Application Priority Data

Jun. 29, 2018 (JP) .................................. 2018-124669

(51) Int. Cl.

| | |
|---|---|
| H03F 3/04 | (2006.01) |
| H03F 3/193 | (2006.01) |
| H03F 3/217 | (2006.01) |
| H03F 3/72 | (2006.01) |
| H03F 1/22 | (2006.01) |
| H03F 1/32 | (2006.01) |

(52) U.S. Cl.
CPC ............. *H03F 3/193* (2013.01); *H03F 1/223* (2013.01); *H03F 1/3205* (2013.01); *H03F 1/3252* (2013.01); *H03F 3/2171* (2013.01); *H03F 3/72* (2013.01)

(58) Field of Classification Search
CPC .......... H03F 3/193; H03F 3/2171; H03F 3/72; H03F 1/223; H03F 1/3252; H03F 1/3205; H03F 2200/18; H03F 2200/294; H03F 1/0261; H03F 2200/451
USPC ................................ 330/296, 311, 285, 277
See application file for complete search history.

(56) References Cited

U.S. PATENT DOCUMENTS

| | | | |
|---|---|---|---|
| 7,696,828 B2 | 4/2010 | Chang | |
| 7,902,925 B2 | 3/2011 | Kim et al. | |

(Continued)

FOREIGN PATENT DOCUMENTS

| | | | |
|---|---|---|---|
| JP | 4838308 B2 | 12/2011 | |
| JP | 5237392 B2 | 7/2013 | |

(Continued)

*Primary Examiner* — Khanh V Nguyen
*Assistant Examiner* — Khiem D Nguyen
(74) *Attorney, Agent, or Firm* — White & Case LLP

(57) ABSTRACT

High frequency amplifier circuitry includes a common-source first transistor to amplify a high-frequency input signal, a common-gate second transistor cascade-connected to the first transistor, to amplify a signal amplified by the first transistor to generate an output signal, a first inductor connected between a source of the first transistor and a first reference potential node, a second inductor connected between a drain of the second transistor and a second reference potential node, and non-linear compensation circuitry connected to a connection node of the first transistor and the second transistor, to compensate for non-linearity of the output signal to the high-frequency input signal. The non-linear compensation circuitry has first rectifier circuitry, a first resistor, a second resistor, second rectifier circuitry, first capacitor and second capacitor.

6 Claims, 10 Drawing Sheets

(56) References Cited

U.S. PATENT DOCUMENTS 8,903,343 B2    12/2014   Holenstein et al.
9,337,777 B2    5/2016   Kim

FOREIGN PATENT DOCUMENTS

| JP | 2016-504893 A | 2/2016 |
| JP | 5979160 B2 | 8/2016 |

HIGH-FREQUENCY AMPLIFIER CIRCUITRY AND SEMICONDUCTOR DEVICE

CROSS REFERENCE TO RELATED APPLICATIONS

This application is based upon and claims the benefit of priority from the prior Japanese Patent Application No. 2018-124669, filed on Jun. 29, 2018, the entire contents of which are incorporated herein by reference.

FIELD

Embodiments of the present discloser relate to a high-frequency amplifier circuit and a semiconductor device.

BACKGROUND

In recent years, it has been considered to replace a fabrication process of a high-frequency low noise amplifier (LNA: Low Noise Amplifier) from an SiGe bipolar process (hereinafter, SiGe process) to an SOI (Silicon On Insulator) CMOS process (hereinafter, SOI process). The SOI process is lower in cost than the SiGe process and parasitic capacitance of an MOS transistor fabricated by the SOI process is small, so that power loss of a high frequency signal becomes small. Therefore, by using the SOI process, it is possible, without degrading electrical characteristics, to form a high frequency switch and a high-frequency low noise amplifier on the same SOI substrate, making one-chip configuration possible.

Gain and noise figure NF are important electrical characteristics required by the LNA. Besides, in recent wireless communication equipment, a carrier aggregation technique for wireless communication utilizing a plurality of bands is essential, and hence it is demanded to raise IIP3 (Input 3rd-order Intercept Point) further. The IIP3 is a cross point at which an extended line of fundamental wave output and an extended line of 3rd-order modulation distortion intersect, the higher the IIP3, the smaller the 3rd-order modulation distortion.

DETAILED DESCRIPTION

According to one embodiment, high frequency amplifier circuitry is provided, which includes a common-source first transistor to amplify a high-frequency input signal, a common-gate second transistor cascade-connected to the first transistor, to amplify further a signal amplified by the first transistor to generate an output signal, a first inductor connected between a source of the first transistor and a first reference potential node, a second inductor connected between a drain of the second transistor and a second reference potential node, and non-linear compensation circuitry connected to a connection node of the first transistor and the second transistor, to compensate for non-linearity of the output signal to the high-frequency input signal. The non-linear compensation circuitry has first rectifier circuitry and a first resistor series-connected between a third reference potential and a fourth reference potential, a second resistor and second rectifier circuitry series-connected between the third reference potential and the fourth reference potential, a first capacitor connected between the connection node of the first transistor and the second transistor, and a connection node of the first rectifier circuitry and the first resistor, and a second capacitor connected between the connection node of the first transistor and the second transistor, and a connection node of the second resistor and the second rectifier circuitry.

Hereinbelow, embodiments will be explained with reference to the accompanying drawings. In the present specification and the accompanying drawings, for easy understanding and simplicity of drawings, the explanation and the drawings are made with part of the configuration being omitted, modified or simplified. However, the technical contents to the extent that a similar function can be expected will be interpreted to be included in the embodiments. In the accompanying drawings of the present specification, for simplicity in drawings and easy understanding, the scale, the ratio of height to width, etc. are modified to be exaggerated from those of actual ones.

First Embodiment

Figure 1:
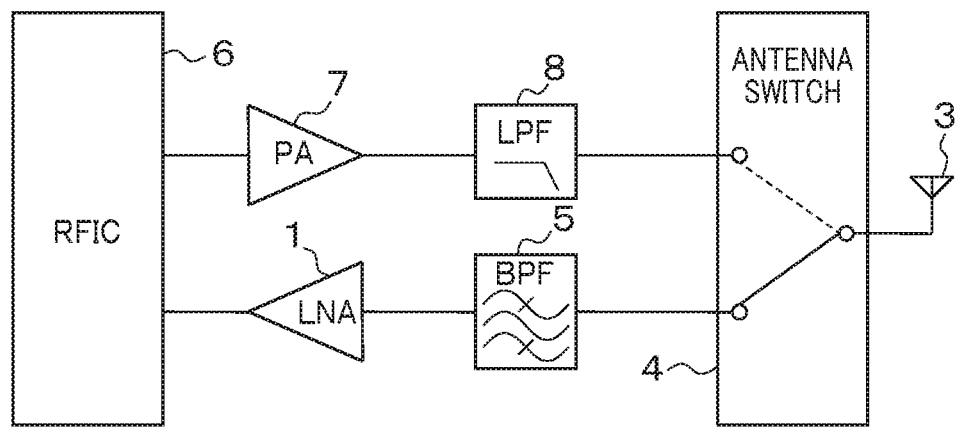
FIG. 1 is a block diagram schematically showing the configuration of a wireless device having an LNA according to a first embodiment built therein.

A high-frequency amplifier circuit (hereinafter, LNA) according to a first embodiment is used in a wireless device 2 such as a mobile phone and a smart phone. FIG. 1 is a block diagram schematically showing the configuration of a wireless device 2 having an LNA 1 according to a first embodiment built therein. The wireless device 2 of FIG. 1 is provided with an antenna 3, an antenna switch 4, a band-pass filter (BPF) 5, the LNA 1, a wireless IC (RF C) 6, a power amplifier (PA) 7, and a low-pass filter (LPF) 8.

The antenna switch 4 switches between transmission and reception. FIG. 1 shows an example of a transmission side and a reception side each having one circuit system. However, the transmission side and the reception side may have a plurality of circuit systems for transmitting and receiving signals in a plurality of frequency bands, respectively. The antenna switch 4 and the LNA 1 of FIG. 1 can be arranged on the same SOI substrate to be formed into one chip. By arranging the antenna switch 4 and the LNA 1 of FIG. 1 on the SOI substrate, a power loss of a high frequency signal can be reduced, and the reduction of power consumption and compactness is possible.

Figure 2:
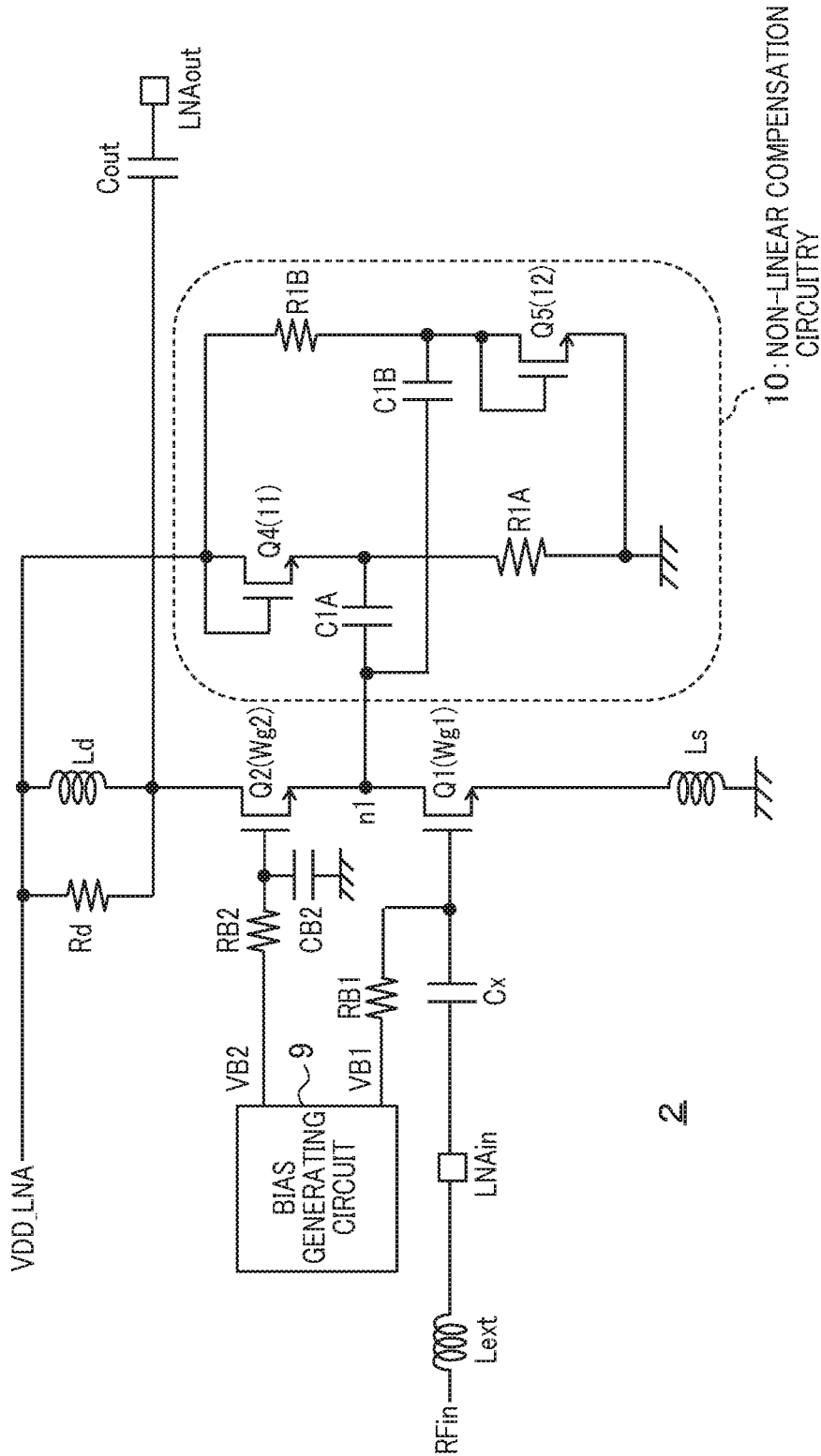
FIG. 2 is a circuit diagram showing the internal configuration of the LNA according to the first embodiment.

FIG. 2 is a circuit diagram showing the internal configuration of the LNA 1 according to the first embodiment. The LNA 1 of FIG. 2 is provided with a common-source first transistor Q1 for amplifying a high-frequency input signal, a common-gate second transistor Q2 for further amplifying a signal amplified by the first transistor Q1 to generate an output signal, a bias generating circuit 9, and a non-linear compensation circuitry 10.

Although the first transistor Q1 and the second transistor Q2 of FIG. 2 are NMOS transistors, both can be configured with PMOS transistors in design. Nevertheless, since electrical characteristics are better in the form of NMOS, hereinafter, an example of the first transistor Q1 and the second transistor Q2 configured with NMOS transistors will be explained. To the gate of the first transistor Q1, an input terminal LNAin is connected via a capacitor Cx. To the input terminal LNAin, a high-frequency input signal RFin is input via an externally-attached inductor Lext. Also to the gate of the first transistor Q1, a predetermined bias voltage VB1 is supplied via a resistor RB1.

A first inductor Ls is connected between the source of the first transistor Q1 and a ground node (first reference potential node). The Inductor Lext, the capacitor Cx, and the first inductor Ls act as an input matching circuit. The capacitor Cx also blocks DC. The first inductor Ls has inductance of, for example, 0.5 nH. Between the gate and source of the first transistor Q1, a capacitor Cin not shown, may be connected. Since the source of the first transistor Q1 is connected to the ground node via the first inductor Ls, the first transistor Q1 acts as a common-source amplifier.

To the gate of the second transistor Q2, a bias voltage VB2 is supplied via a resistor RB2. A capacitor CB2 is connected between the gate of the second transistor Q2 and a ground node. Since the capacitance of the capacitor CB2 and the resistance value of the resistor RB2 are both large enough, the second transistor Q2 acts as a common-gate amplifier.

Between the drain of the second transistor Q2 and a second reference potential VDD_LNA, a resistor Rd and a second inductor Ld are connected in parallel. The second inductor Ld has inductance of, for example, 6 nH. The resistor Rd is provided for gain adjustment and stabilization. Since the LNA 1 according to the present embodiment is formed on the SOI substrate, the first and second inductors Ls and Ld are spiral inductors made of a spiral wiring pattern.

The drain of the second transistor Q2 is connected to an output terminal LNAout via a capacitor Cout. The Resistor Rd, the second inductor Ld, and the capacitor Cout act as an output matching circuit.

Although the first transistor Q1 and the second transistor Q2 are different in gate width, they are the same as each other in other device constants. A gate width Wg2 of the second transistor Q2 is larger than a gate width Wg1 of the first transistor Q1. The gate width Wg1 of the first transistor Q1 is, for example, 200 μm. The gate width Wg2 of the second transistor Q2 is, for example, 300 μm. The first transistor Q1 and the second transistor Q2 may be different from each other in at least part of device constants other than the gate width. For example, a gate oxide film of the second transistor Q2 may be thicker than a gate oxide film of the first transistor Q1. In this case, although the second transistor Q2 is lower in transconductance gm than the first transistor Q1, by thickening the gate width of the second transistor Q2 larger than the gate width of the first transistor Q1, the reduction of gm can be restricted.

The bias generating circuit 9 generates the bias voltages VB1 and VB2, The resistors RB1 and RB2 are provided to prevent the high-frequency input signal RFin from being input to the bias generating circuit 9. The bias voltage VB1 is, for example 0.5 volts. The bias voltage VB2 is, for example 1.2 volts. The second reference potential VDD_LNA is, for example, 1.8 volts.

The LNA 1 is required to have a gain of, for example, 18 dB, noise figure NF of, for example, below 0.8 dB, and IIP3 of 3 dBm or higher. Therefore, it is a characteristic of the present embodiment to have IIP3 of 3 dBm or higher without reducing the gain and noise figure so much.

In more specifically, by being provided with the non-linear compensation circuitry 10, the LNA 1 according to the present embodiment has IIP3 of 3 dBm or higher. The non-linear compensation circuitry 10 is connected to a connection node n1 of the first transistor Q1 and the second transistor Q2. In other words, the non-linear compensation circuitry 10 is connected to the drain of the first transistor Q1 and to the source of the second transistor Q2.

To the non-linear compensation circuitry 10, the second reference potential VDD_LNA and a ground node are connected. Moreover, since it is enough for the non-linear compensation circuitry 10 to be connected between two reference potentials, the non-linear compensation circuitry 10 may be connected between a third reference potential other than VDD_LNA and a fourth reference potential other than the ground potential.

The non-linear compensation circuitry 10 is connected to the connection node n1 of the first transistor Q1 and the second transistor Q2, to compensate for output signal non-linearity to the high-frequency input signal RFin. The non-linear compensation circuitry 10 has a first rectifier circuitry 11, a second rectifier circuitry 12, a first resistor R1A, a second resistor R1B, a first capacitor C1A, and a second capacitor C1B.

The first rectifier circuitry 11 and the first resistor R1A are connected in series between the second reference potential VDD_LNA and the ground potential. The second resistor R1B and the second rectifier circuitry 12 are connected in series between the second reference potential VDD_LNA and the ground potential.

A connection node of the first rectifier circuitry 11 and the first resistor R1A is connected to the connection node n1 of the first transistor Q1 and the second transistor Q2 via the first capacitor C1A. Likewise, a connection node of the second resistor R1B and the second rectifier circuitry 12 is connected to the connection node n1 of the first transistor Q1 and the second transistor Q2 via the second capacitor C2A.

The first rectifier circuitry 11 has a diode-connected fourth transistor Q4. The second rectifier circuitry 12 has a diode-connected fifth transistor Q5. To the drain and gate of the fourth transistor Q4, the second reference potential VDD_LNA is supplied, and to the source of the fourth transistor Q4, one end of the first resistor R1A is connected. To the drain and gate of the fifth transistor Q5, one end of the second resistor R1B is connected, and to the source of the fifth transistor Q5, a ground node is connected.

The fourth transistor Q4 and the fifth transistor Q5 have the same device constants. The device constants are various parameters such as a gate width, a gate length, a threshold voltage, and a gate-oxide film thickness, which define the transistor electrical characteristics. The first resistors R1A and R1B have the same resistance. The first capacitor C1A and the second capacitor C2A have the same capacitance.

As described above, the non-linear compensation circuitry 10 is provided with two series circuits each configured with a transistor and a resistor, in a reverse order of transistor-resistor connection, vice versa, in these series circuits. According to this configuration, even-order intermodulation distortion can be canceled.

Moreover, in the non-linear compensation circuitry 10 according to the present embodiment, in order to have high IIP3 as much as possible, at least one of the device constants of the fourth transistor Q4 and the fifth transistor Q5, the resistance values of the first resistors R1A and R1B, and the capacitance of the first capacitor C1A and second capacitor C2A can be adjusted. According to the adjustment, IIP3 can be raised without reducing the gain and noise figure so much.

The values of each component in the LNA 1 of FIG. 2 can be set, for example, as follows. For the first, second, fourth, and fifth transistors Q1, Q2, Q4, and Q5, the gate oxide film thickness is set to 2.5 nm, the gate length is set to 0.14 μm, and the threshold voltage Vth is set to 0.3 volts. For the first transistor Q1, the gate width Wg is set to 300 μm. For the second transistor Q2, the gate width Wg is set to 400 μm. For the fourth and fifth transistors Q4 and Q5, the gate width Wg is set to 5 μm. For the first resistor R1A and the second resistor R1B, the resistance value is set to 14kΩ. For the capacitors C1A and C1B, the capacitance is set to 0.24 pF. By setting the values of each component in the LNA 1 of FIG. 2 to those values and performing simulation, the S-parameters, IIP3, and noise figure NF can be calculated.

Figure 3B:
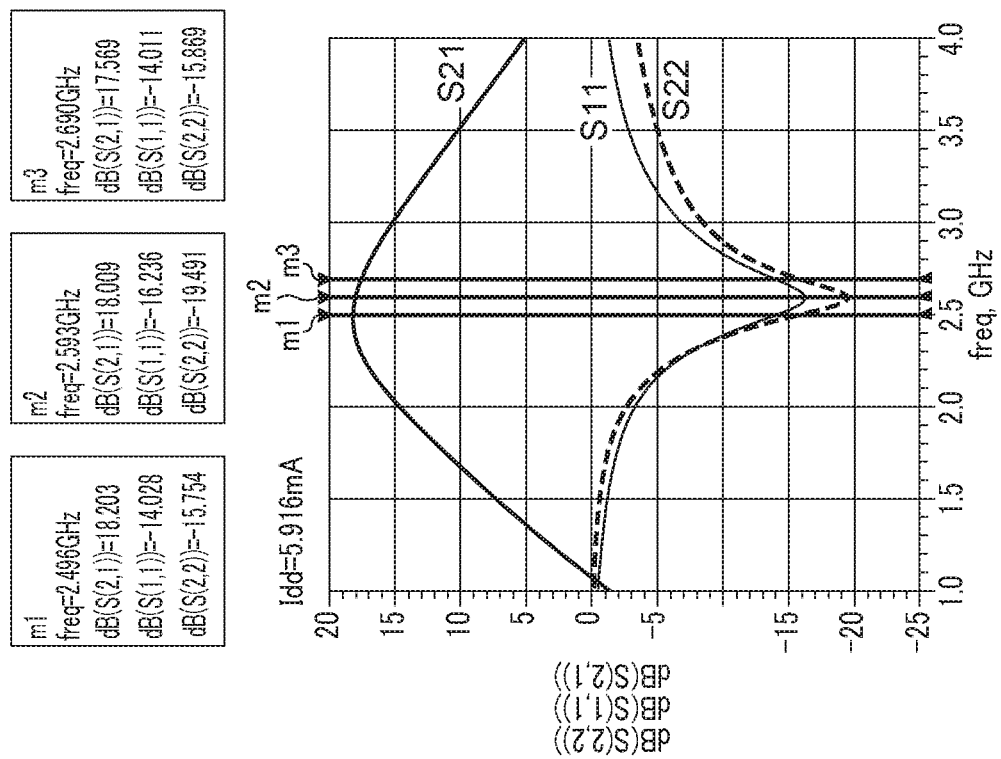
FIGS. 3A and 3B are figures showing S-parameters for the LNA of FIG. 2 and an LNA according to one comparative example.
Figure 3A:
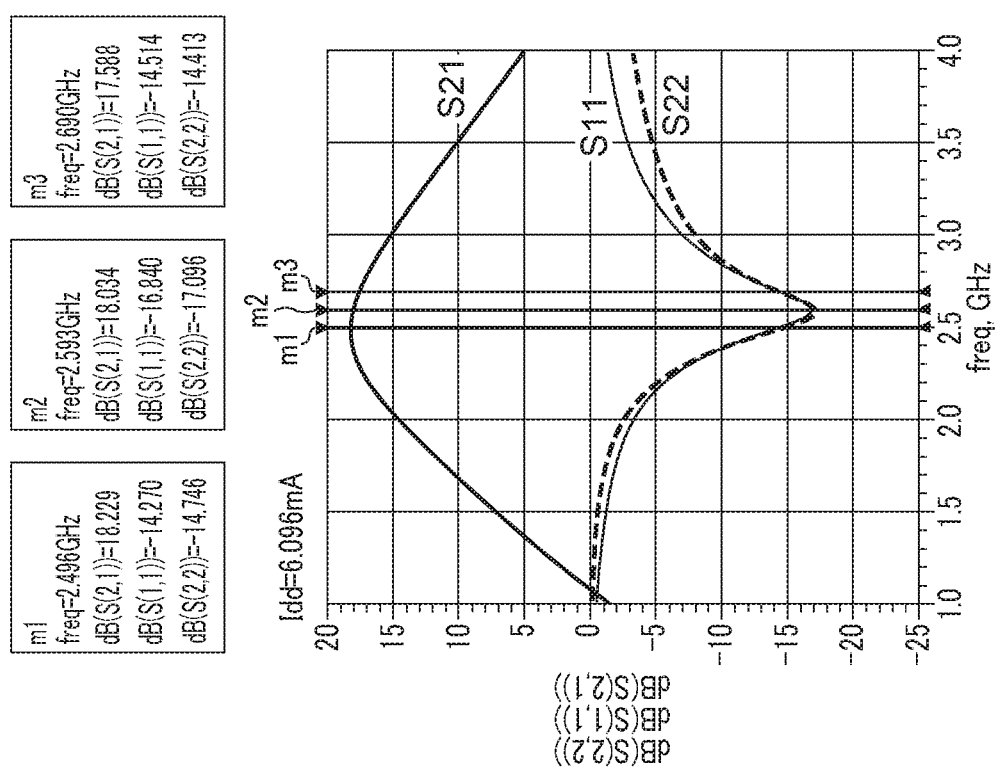

FIG. 3 is a figure showing S-parameters for the LNA 1 of FIG. 2 and an LNA 1 according to one comparative example configured by omitting the non-linear compensation circuitry 10 from the LNA 1 of FIG. 2. FIG. 3A shows S-parameters of the LNA 1 of FIG. 2. FIG. 3B shows S-parameters of the LNA 1 according to the one comparative example, without the non-linear compensation circuitry 10. In FIG. 3A, the abscissa is frequency [GHz] and the ordinate is S-parameter value [dB], with S11, S22, and S21 representing input-side reflection characteristics, output-side reflection characteristics, and transmission characteristics from the input side, respectively.

Figure 4:
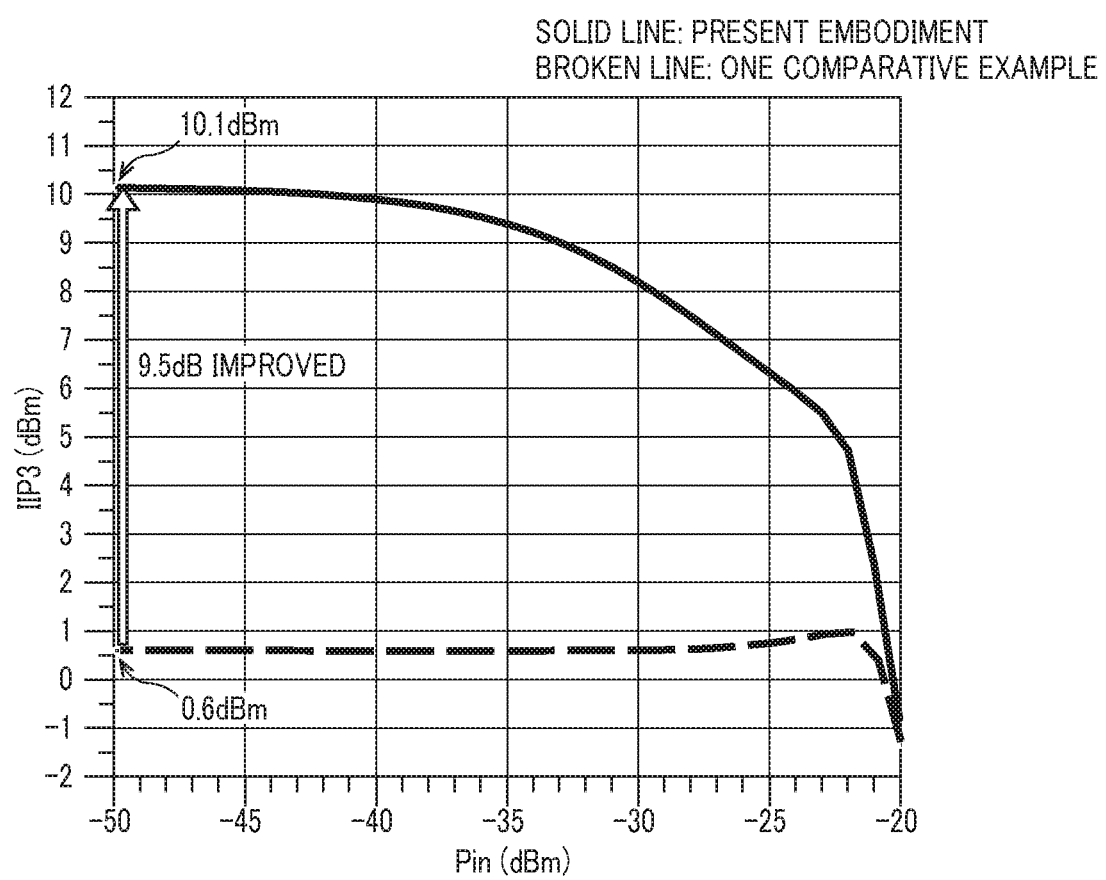
FIG. 4 is a figure comparing IIP3 between the LNA of FIG. 2 and the LNA of the one comparative example.

In FIG. 3A and FIG. 3B, marks are put on 2.496 GHz, 2.593 GHz, and 2.690 GHz in a frequency range of Band 41 that is one of LTE (Long Term Evolution) bands. The LNA 1 according to the present embodiment is designed to be used in a frequency range of Band 41, As understood from FIG. 3A, the S-parameters in the frequency range of Band 41 are satisfactory. For example, the gain at the band center frequency of 2.593 GHz is 18.0 dB for both of the present embodiment and the one comparative example, with S11 and S22 keeping generally-required standard values (−12 dB or lower). A bias current Idd is 6.096 mA in the LNA 1 of the present embodiment and 5.916 mA in the LNA 1 of the one comparative example. The bias current Idd is slightly larger in the LNA 1 of the present embodiment than in the LNA 1 of the one comparative example. This is because of a bias current of the non-linear compensation circuitry 10 added in the LNA 1 of the present embodiment, FIG. 4 is a figure comparing IIP3 between the LNA 1 of FIG. 2 and the LNA 1 of the one comparative example. In FIG. 4, the abscissa is input signal power Pin (dBm) and the ordinate is IIP3 (dBm). In FIG. 4, a solid-line curve indicates the LNA 1 of FIG. 2 and a broken-line curve indicates the LNA 1 of the one comparative example. As shown in FIG. 4, the LNA 1 of FIG. 2 has higher IIP3 than the one comparative example in a wide range of the input signal power Pin. Accordingly, it is found that, by providing the non-linear compensation circuitry 10, IIP3 becomes further higher. For example, when compared at Pin=−50 dBm, the one comparative example shows 0.6 dBm whereas the LNA 1 of FIG. 2 shows 10.1 dBm which is superior by 9.5 dB.

Figure 5:
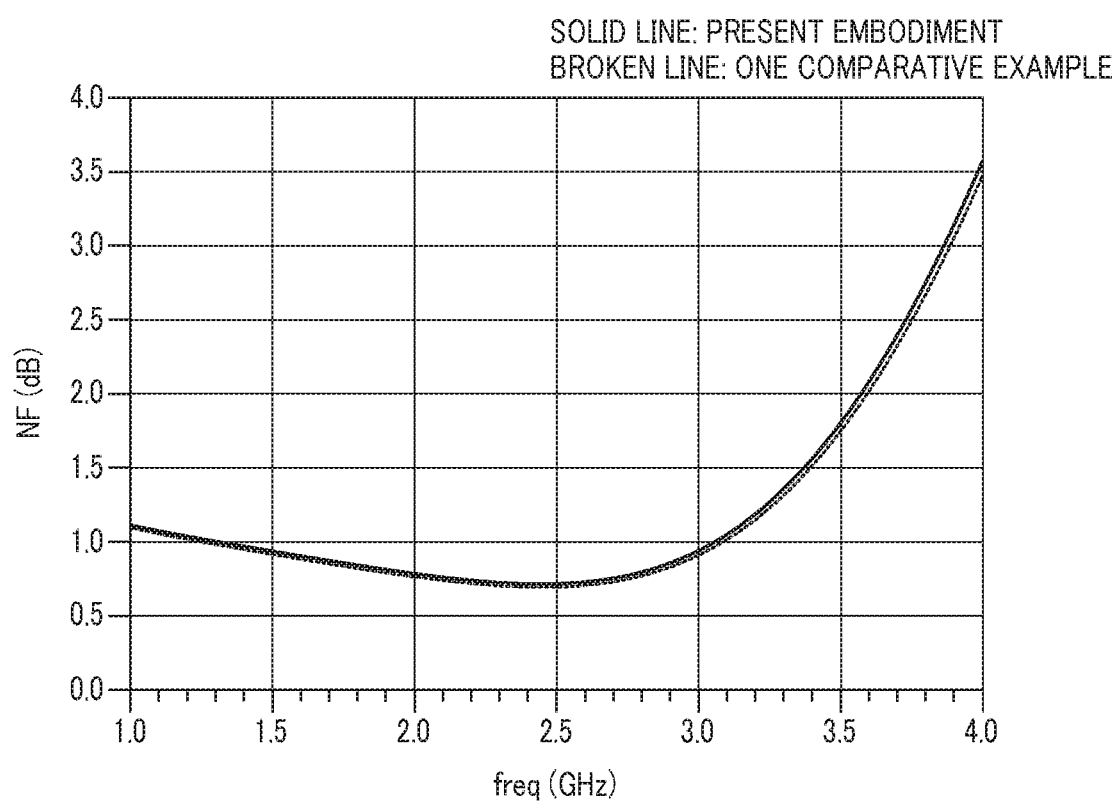
FIG. 5 is a figure comparing noise figure between the LNA of FIG. 2 and the LNA of the one comparative example.

FIG. 5 is a figure comparing noise figure NF between the LNA 1 of FIG. 2 and the LNA 1 of the one comparative example. In FIG. 5, the abscissa is output signal frequency (GHz) and the ordinate is noise figure NF (dB). In FIG. 5, a solid-line curve indicates the LNA 1 of FIG. 2 and a broken-line curve indicates the LNA 1 of the one comparative example. As understood from FIG. 5, in the range of Band 41, the noise figure is NF 0.753 dB or lower, sufficiently low. Although the noise figure NF is a little bit lower in the LNA 1 of the one comparative example than in the LNA 1 of the present embodiment, their difference is 0.025 dB or lower which is a margin of error.

As described above, according to the present embodiment, in the LNA 1, the non-linear compensation circuitry 10 is connected to the connection node n1 of the first transistor Q1 and the second transistor Q2, and, in the non-linear compensation circuitry 10, at least one of the device constants of the fourth transistor Q4 and the fifth transistor Q5, the resistance values of the first resistors R1A and R1B, and capacitance of the first capacitor C1A and the second capacitor C2A is adjusted. Therefore, IIP3 can be raised markedly without reducing the gain and noise figure NF so much. Moreover, the non-linear compensation circuitry 10 has a series circuit of the fourth transistor Q4 and the first resistor R1A, and a series circuit of the second resistor R1B and the fifth transistor Q5, in a reverse order of transistor-resistor connection, vice versa, in these series circuits. Accordingly, even-order intermodulation distortion can be canceled.

Moreover, since the LNA 1 according to the present embodiment can be arranged with the antenna switch 4 of FIG. on the same SOI substrate, the reduction of power consumption and compactness are possible.

Second Embodiment

The LNA 1 according to the above-described first embodiment is provided with an amplifier having the common-gate second transistor Q2. However, in order to raise the gain further, the common-gate amplifier may be formed into a two-stage configuration. If the power supply voltage is high, the common-gate amplifier may be formed into a three-stage configuration or more. However, in the present embodiment, it is presupposed that the power supply voltage is about 1.8 volts. Therefore, the maximum stage number of the common-gate amplifier may be limited to two.

Figure 6:
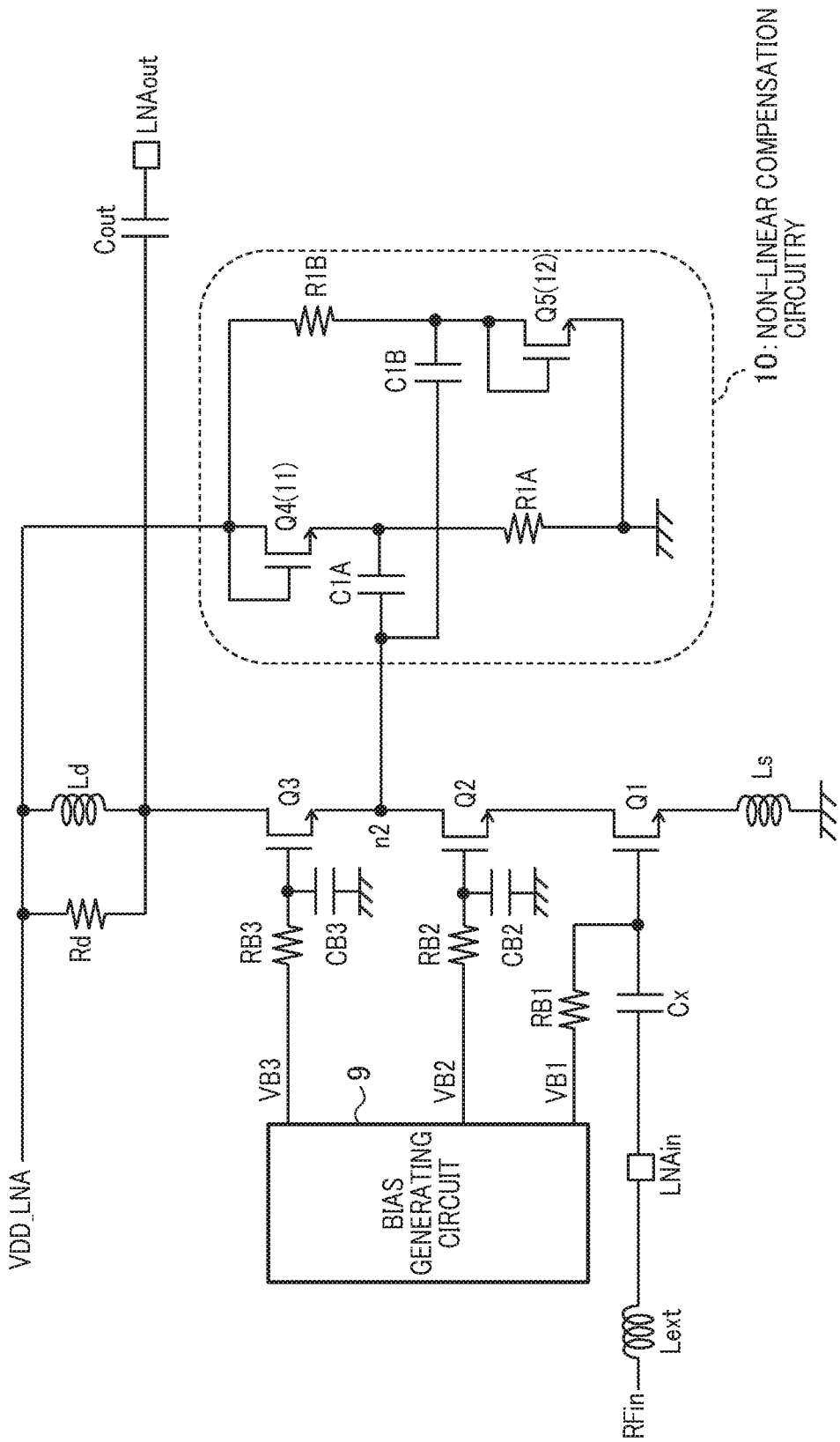
FIG. 6 is a circuit diagram of an LNA according to a second embodiment.

FIG. 6 is a circuit diagram of an LNA 1 according to a second embodiment. In FIG. 6, the components equivalent to those of FIG. 2 are given the same signs. In the LNA 1 of FIG. 6, a common-gate third transistor Q3 is cascade-connected to the drain of the common-gate second transistor Q2. Accordingly, in the LNA 1 of FIG. 6, the first to third transistors Q1 to Q3 are cascade-connected. The drain of the third transistor Q3 is connected to each end of a resistor Rd and a second inductor Ld. A drain voltage (output voltage) of the third transistor Q3 is output from an output terminal LNAout via a capacitor Cout. A capacitor CB3 is connected between the gate of the third transistor Q3 and a ground node. To the gate of the third transistor Q3, a bias voltage VB3 is input via a resistor RB3.

A non-linear compensation circuitry 10 having the same configuration as that of FIG. 2 is connected to a connection node n2 of the second transistor Q2 and the third transistor Q3, The present inventor performed simulation by connecting the non-linear compensation circuitry 10, not to the connection node n2 of the second transistor Q2 and the third transistor Q3, but to a connection node n1 of the first transistor Q1 and the second transistor Q2, however, a satisfactory result could not be obtained.

The values of each component in the LNA 1 of FIG. 6 can be set, for example, as follows. For the first transistor Q1 to the fifth transistor Q5, the gate oxide film thickness is set to 2. 5 nm, the gate length is set to 0.14 μm, and the threshold voltage Vth is set to 0.3 volts. For the first to third transistors Q1 to Q3, the gate width Wg is set to 300 μm. For the fourth and the fifth transistors Q4 and Q5, the gate width Wg is set to 5 μm. For the first resistor R1A and the second resistor R1B, the resistance value is set to 20kΩ. For the capacitors C1A and C1B, the capacitance is set to 0.15 pF. By setting the values of each component in the LNA 1 of FIG. 6 to those values and performing simulation, the S-parameters, IIP3, and noise figure NF can be calculated.

Figure 7:
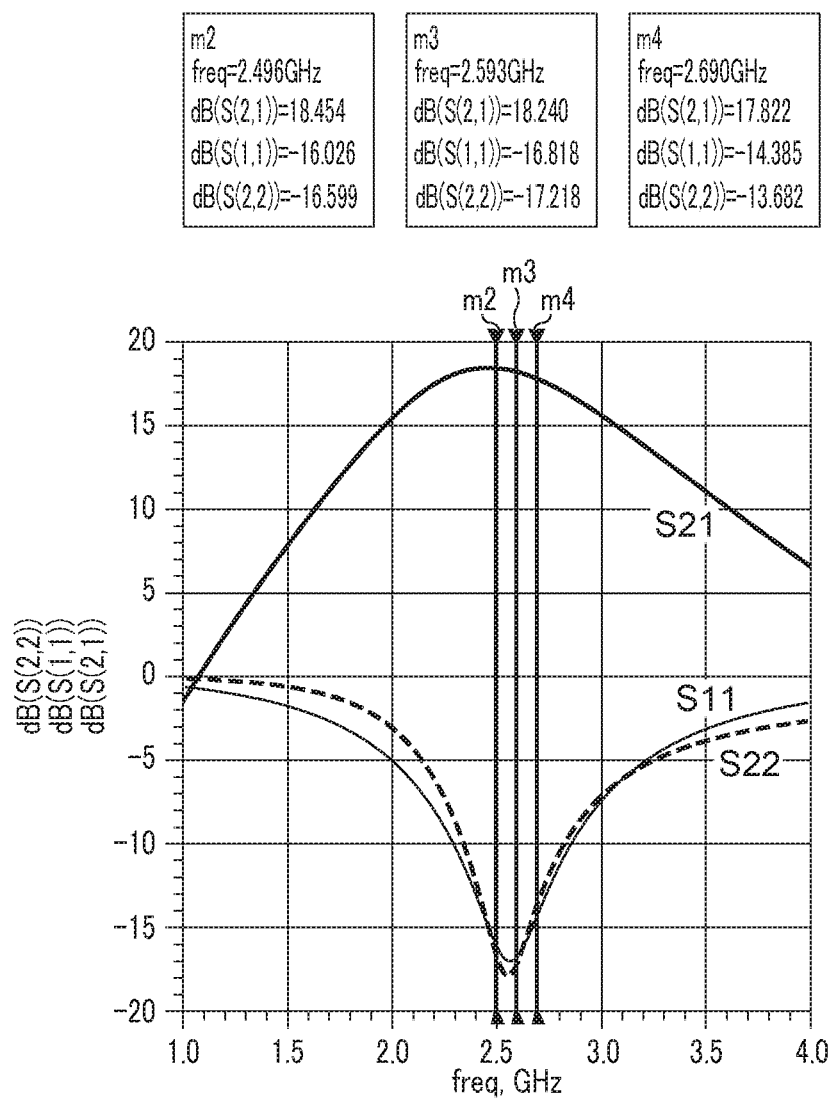
FIG. 7 is a figure showing S-parameters for the LNA of FIG. 6.

FIG. 7 is a figure showing S-parameters for the LNA 1 of FIG. 6. As shown, in the frequency range of Band 41 that is one of the LTE bands, S11 is −14 dB or lower and S22 is −13 dB or lower, keeping generally-required standard values (−12 dB or lower). Gain S21 at the band center frequency of 2.593 GHz is 18.2 dB, and thus a sufficient gain is obtained.

Figure 8:
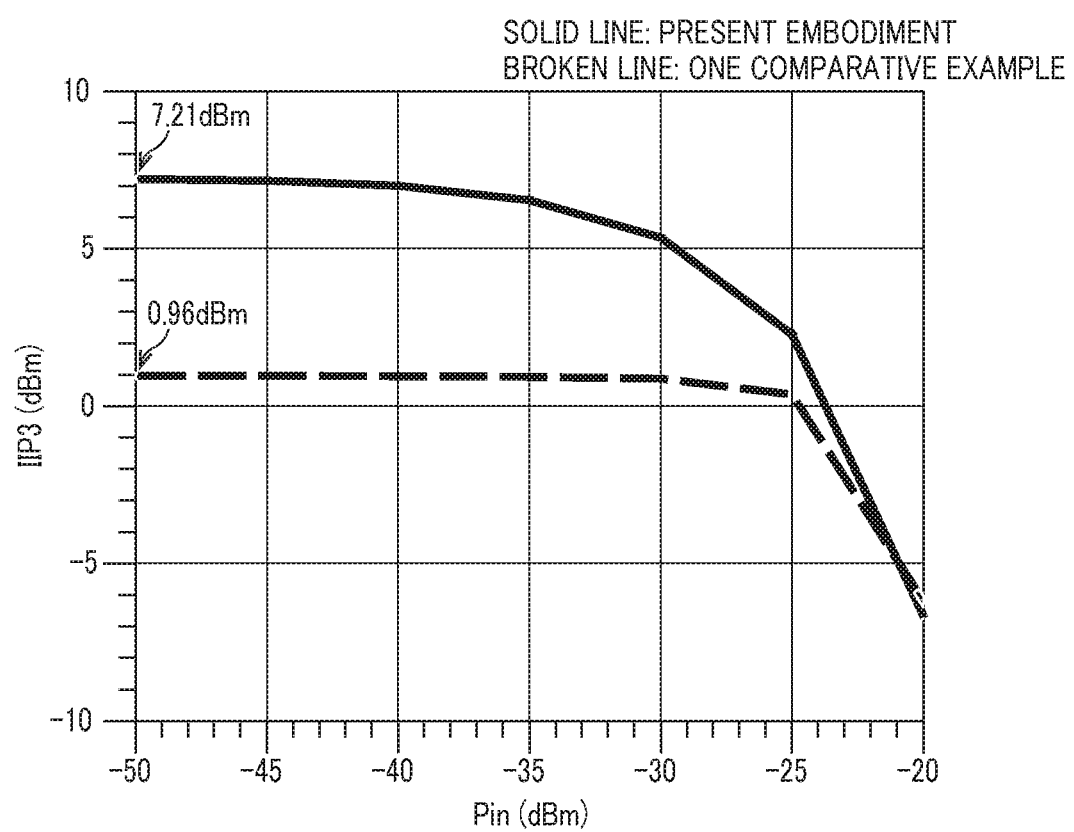
FIG. 8 is a figure comparing IIP3 between the LNA of FIG. 6 and an LNA of one comparative example configured by omitting a non-linear compensation circuitry from the LNA of FIG. 6.

FIG. 8 is a figure comparing IIP3 between the LNA 1 of FIG. 6 and an LNA 1 of one comparative example configured by omitting the non-linear compensation circuitry 10 from the LNA 1 of FIG. 6. In FIG. 8, the abscissa is input signal power Pin (dBm) and the ordinate is IIP3 (dBm). In FIG. 8, a solid-line curve indicates the LNA 1 of FIG. 6 and a broken-line curve indicates the LNA 1 of the one comparative example. When compared at Pin=−50 dBm, the one comparative example shows 0.96 dBm whereas the LNA 1 of FIG. 6 shows 7.21 dBm which is superior by 6.25 dB.

Figure 9:
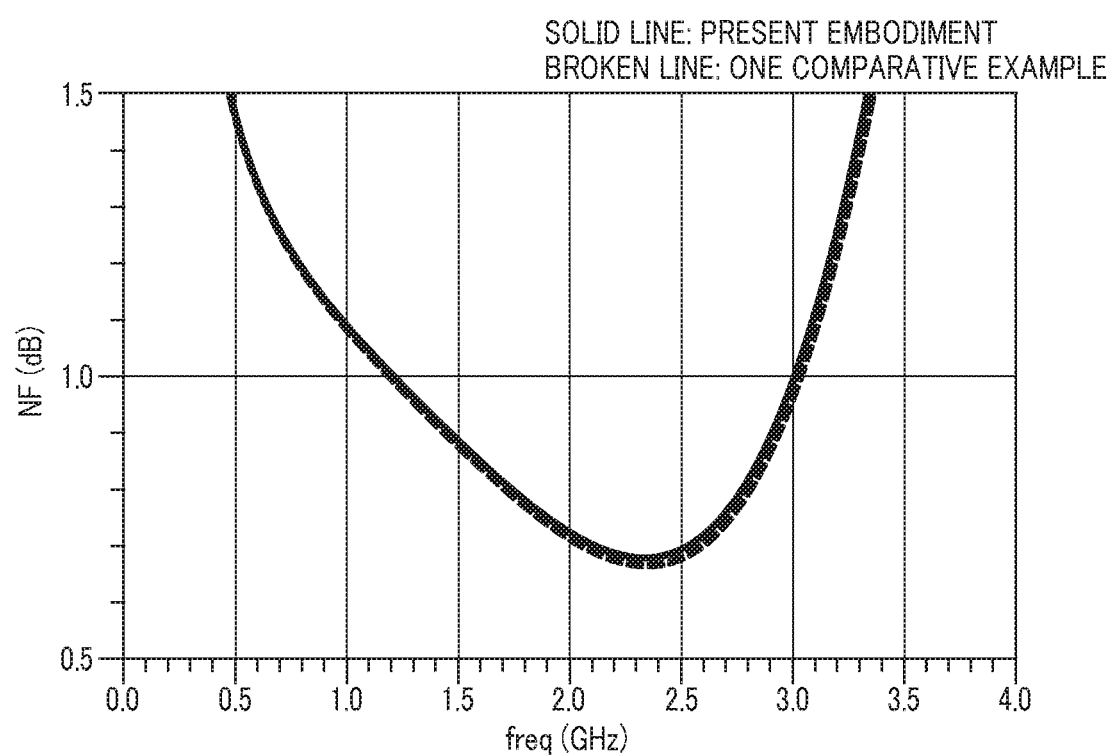
FIG. 9 is a figure comparing noise figure between the LNA of FIG. 6 and the LNA of the one comparative example.

FIG. 9 is a figure comparing noise figure NF between the LNA 1 of FIG. 6 and the LNA 1 of the one comparative example. In FIG. 9, the abscissa is output signal frequency (GHz) and the ordinate is noise figure NF (dB), In FIG. 9, a solid-line curve indicates the LNA 1 of FIG. 6 and a broken-line curve indicates the LNA 1 of the one comparative example. As understood from FIG. 9, although the noise figure NF is higher in the LNA 1 of FIG. 6 by about 0.02 dB than in the LNA 1 of the one comparative example, it is at an acceptable level.

As described above, the LNA 1 according to the second embodiment is provided with the common-gate amplifier formed into the two-stage configuration, and hence a higher gain than the first embodiment is achieved. Moreover, since the non-linear compensation circuitry 10 is provided in the same manner as the first embodiment, IIP3 can be raised further without reducing the gain and noise figure NF so much.

Third Embodiment

Figure 10:
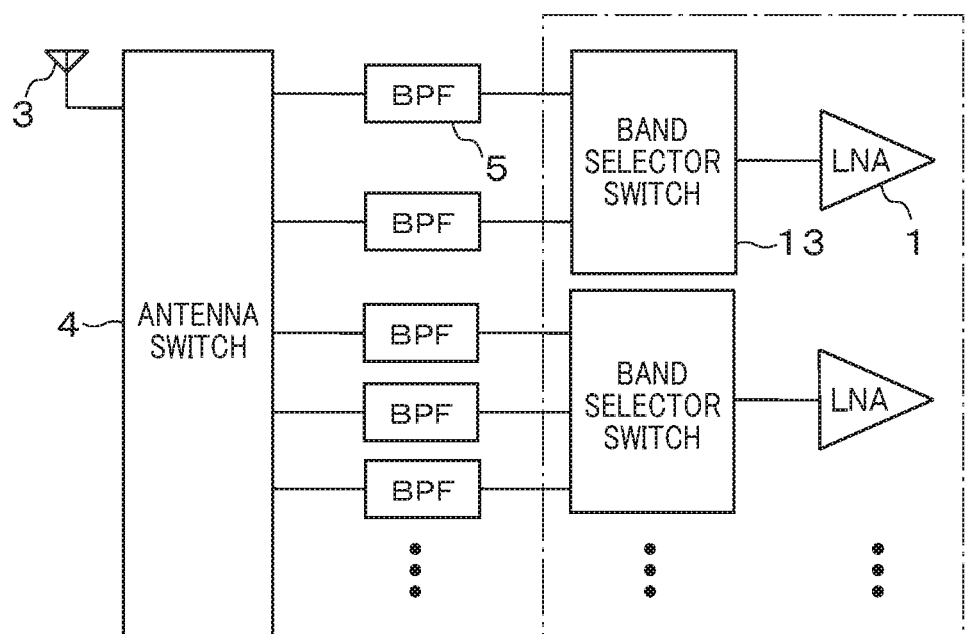
FIG. 10 is a block diagram schematically showing the configuration of a wireless device conforming to carrier aggregation.

Recent mobile communication equipment often perform wireless communication using a carrier aggregation technique for wireless communication utilizing a plurality of bands. In this case, it is required to arrange a plurality of LNAs 1 and a plurality of band selector switches on an SOI substrate, FIG. 10 is a block diagram schematically showing the configuration of a wireless device 2 conforming to carrier aggregation. FIG. 10 shows a block diagram of a reception circuit for signal reception from an antenna 3. The block diagram of a transmission circuit is the same as that of FIG. 1.

The wireless device 2 of FIG. 10 is provided with an antenna switch 4, a plurality of band-pass filters 5, a plurality of band selector switches 13, and a plurality of LNAs 1. The plurality of band selector switches 13 and the plurality of LNAs 1 are arranged on the same SOI substrate, which can be formed into one chip, or may be arranged on the same SOT substrate together with the antenna switch 4 to be formed into one chip.

The plurality of LNAs 1 of FIG. 10 each are the LNA 1 according to the first or the second embodiment. A reception signal at each frequency switched by the antenna switch 4 is, after passing through the corresponding band-pass filter 5, input to the corresponding band selector switch 13. An input signal selected by the band selector switch 13 is input to the corresponding LNA 1 to be amplified in a predetermined gain mode.

By arranging the plurality of band selector switches 13 and the plurality of LNAs 1 on the SOI substrate, compactness and low power consumption are possible.

Although, in the above-described first to third embodiments, the examples of arrangement of LNA 1 on the SOI substrate are explained, the LNA 1 according to the above-described first to third embodiments may be disposed on a bulk silicon substrate. Even in the LNA 1 disposed on the bulk silicon substrate, by providing the above-described non-linear compensation circuitry 10 inside the LNA 1, it is possible to raise IIP3 further.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:
1. High frequency amplifier circuitry comprising:
a common-source first transistor to amplify a high-frequency input signal;
a common-gate second transistor cascade-connected to the first transistor, to amplify further a signal amplified by the first transistor to generate an output signal;
a first inductor connected between a source of the first transistor and a first reference potential node;
a second inductor connected between a drain of the second transistor and a second reference potential node; and
non-linear compensation circuitry connected to a connection node of the first transistor and the second transistor, to compensate for non-linearity of the output signal to the high-frequency input signal,
wherein the non-linear compensation circuitry comprises:
first rectifier circuitry and a first resistor series-connected between a third reference potential and a fourth reference potential;
a second resistor and second rectifier circuitry series-connected between the third reference potential and the fourth reference potential;
a first capacitor connected between the connection node of the first transistor and the second transistor, and a connection node of the first rectifier circuitry and the first resistor; and a second capacitor connected between the connection node of the first transistor and the second transistor, and a connection node of the second resistor and the second rectifier circuitry.

2. The high-frequency amplifier circuitry of claim 1 further comprising an SOI (Silicon On Insulator) substrate having built thereon the first transistor, the second transistor, the first inductor, the second inductor, and the non-linear compensation circuitry.

3. High-frequency amplifier circuitry comprising:
a common-source first transistor to amplify a high-frequency input signal;
a common-gate second transistor cascade-connected to the first transistor, to amplify further a signal amplified by the first transistor;
a common-gate third transistor cascade-connected to the second transistor, to amplify further a signal amplified by the second transistor to generate an output signal;
a first inductor connected between a source of the first transistor and a first reference potential node;
a second inductor connected between a drain of the second transistor and a second reference potential node; and
non-linear compensation circuitry connected to a connection node of the second transistor and the third transistor, to compensate for non-linearity of the output signal to the high-frequency input signal,
wherein the non-linear compensation circuitry comprises:
first rectifier circuitry and a first resistor series-connected between a third reference potential and a fourth reference potential;
a second resistor and second rectifier circuitry series-connected between the third reference potential and the fourth reference potential;
a first capacitor connected between the connection node of the second transistor and the third transistor, and a connection node of the first rectifier circuitry and the first resistor; and
a second capacitor connected between the connection node of the second transistor and the third transistor, and a connection node of the second resistor and the second rectifier circuitry.

4. The high-frequency amplifier circuitry of claim 3 further comprising an SOI (Silicon On Insulator) substrate having built thereon the first transistor, the second transistor, the first inductor, the second inductor, and the non-linear compensation circuitry.

5. A semiconductor device comprising:
a plurality of high frequency amplifier circuitries arranged on an SOI (Silicon On Insulator) substrate; and
a plurality of high frequency switches provided corresponding to the plurality of high frequency amplifier circuitries, respectively, on the SOI substrate, to select one of a plurality of high frequency signals to supply the one high frequency signal to a corresponding high frequency amplifier circuitry,
wherein the high frequency amplifier circuitries comprise:
a common-source first transistor to amplify a high-frequency input signal from a corresponding high frequency switch;
a common-gate second transistor cascade-connected to the first transistor, to amplify further a signal amplified by the first transistor to generate an output signal;
a first inductor connected between a source of the first transistor and a first reference potential node;
a second inductor connected between a drain of the second transistor and a second reference potential node; and
non-linear compensation circuitry connected to a connection node of the first transistor and the second transistor, to compensate for non-linearity of the output signal to the high-frequency input signal, and
wherein the non-linear compensation circuitry comprises:
first rectifier circuitry and a first resistor series-connected between a third reference potential and a fourth reference potential;
a second resistor and second rectifier circuitry series-connected between the third reference potential and the fourth reference potential;
a first capacitor connected between the connection node of the first transistor and the second transistor, and a connection node of the first rectifier circuitry and the first resistor; and
a second capacitor connected between the connection node of the first transistor and the second transistor, and a connection node of the second resistor and the second rectifier circuitry.

6. The semiconductor device of claim 5 further comprising an SOI (Silicon On Insulator) substrate having built thereon the first transistor, the second transistor, the first inductor, the second inductor, and the non-linear compensation circuitry.

* * * * *